United States Patent [19]

Garner

[11] Patent Number: 4,947,454
[45] Date of Patent: Aug. 7, 1990

[54] RADIO WITH DIGITALLY CONTROLLED AUDIO PROCESSOR

[75] Inventor: Terry N. Garner, Lynchburg, Va.

[73] Assignee: General Electric Company, Lynchburg, Va.

[21] Appl. No.: 39,245

[22] Filed: Apr. 17, 1987

Related U.S. Application Data

[63] Continuation-in-part of Ser. No. 844,158, Mar. 26, 1986, Pat. No. 4,870,699.

[51] Int. Cl.$^5$ .................... H04B 1/40; H04B 11/16; H04J 3/16
[52] U.S. Cl. ....................................... 455/84; 455/88; 455/186; 455/249; 370/951
[58] Field of Search .................. 455/89, 90, 249, 348, 455/349, 350, 17, 351, 7, 9, 35, 38, 76, 78, 84, 88, 33, 218, 34, 221, 183, 185, 186, 54, 56; 370/24, 26, 95, 95.1, 85.7; 381/74, 87-90, 183; 379/430, 59, 63

[56] References Cited

U.S. PATENT DOCUMENTS

| | | | |
|---|---|---|---|
| 4,189,689 | 6/1980 | Triplett . | |
| 4,254,504 | 11/1981 | Lewis et al. . | |
| 4,282,497 | 3/1981 | Hulbert . | |
| 4,373,706 | 6/1983 | Suzuki et al. . | |
| 4,404,685 | 2/1983 | Rogers . | |
| 4,484,355 | 11/1984 | Henke et al. . | |
| 4,486,624 | 12/1984 | Puhl et al. | 455/77 |
| 4,543,661 | 2/1985 | Defeuilly et al. . | |
| 4,618,997 | 10/1986 | Imazeki et al. | 455/183 |
| 4,625,331 | 11/1986 | Richardson et al. | 455/35 |
| 4,646,358 | 2/1987 | Shanley | 455/35 |
| 4,658,435 | 4/1987 | Childress et al. | 455/17 |
| 4,688,261 | 8/1987 | Killoway | 455/186 |
| 4,727,591 | 2/1988 | Manlove | 455/183 |
| 4,771,391 | 8/1987 | Snowden et al. . | |

FOREIGN PATENT DOCUMENTS

| | | |
|---|---|---|
| 0038580 | 4/1981 | European Pat. Off. . |
| 0075376 | 5/1981 | European Pat. Off. . |
| 0033390 | 11/1981 | European Pat. Off. . |
| 0046835 | 3/1982 | European Pat. Off. . |
| 0201424 | 11/1983 | Japan .................... 455/35 |
| 2003685 | 6/1979 | United Kingdom . |
| 2015837 | 10/1979 | United Kingdom . |
| 2064905 | 12/1981 | United Kingdom . |

OTHER PUBLICATIONS

*Mobile Radio GE-MARC®V.E CLASSIC II Trunked Mobile Radio Communication System Maintenance Manual LB*131455, pp. 1–12, General Electric Co., May 1985.
*GE-MARC®V.E CLASSIC II Trunked Mobile Radio Communication System Maintenance Manuel LBI--31456B*, General Electric Co., May 1985.

(List continued on next page.)

*Primary Examiner*—Reinhard J. Eisenzopf
*Assistant Examiner*—Curtis Kuntz
*Attorney, Agent, or Firm*—Nixon & Vanderhye

[57] ABSTRACT

A mobile radio is disclosed which includes an integrated circuit audio processor which operates under the control of at least one microprocessor. The audio processor provides basic transmit/receive audio filters, tone signaling filters, squelch filters, an RF power level control circuit, a DC voltage measuring circuit, a volume level adjusting circuit, and a transmit level adjusting circuit. In the audio processor, audio bandwidth, tone filter response, squelch filter response and other operating characteristics are adjusted by an incoming data bit stream from the controlling microprocessor. In addition, in response to data received from a microprocessor, the audio processor is controlled, for example, to have its receive audio path closed and its transmit audio path opened to switch from the receive to transmit mode. Based on digital control data received at predetermined input pins, the audio processor of the present invention has its filter responses, signal paths, and other characteristics altered in a predetermined manner to configure the audio processor to appropriately operate in the transmit and receive modes.

55 Claims, 2 Drawing Sheets

OTHER PUBLICATIONS

*GE-MARC®V.E TMX-8210, TMX-8310 and TMX-8510 800 MHz, 10-WATTS Two-Way FM Trunked Mobile Radio Combination Maintenance Manual LBI-31639B*, General Electric Co., Aug. 1986.
*CARFONE CELLULAR MOBILE RADIO Maintenance Manual LBI-31574D*, General Electric Co., Mar. 1986.
*CARFONE CELLULAR MOBILE RADIO Maintenance Manual LBI-31574D*, General Electric Co., 1986.
*MAINTENANCE MANUAL GE-STAR® CELLULAR MOBILE RADIO, LB131335B*, General Electric Co., 1984.
Groh et al., "The uP: The Key to an Advanced Frequency Synthesized HF SSP Amateur Radio Transceiver", *IEEE Transactions of Consumer Electronics*, vol. CF-26, Aug. (1980), pp. 234–246.
*Dyna T-A-C 6000X Universal Mobile Telephone*, Motorola Corporation, Schaumberg, Ill.
*The Radio Amateur's Handbook*, 54th Edition, pp. 397–399 (Apr. 1977).
"Functional Description for Audio Processor PL19B801370", 10/85, pp. 1–23, General Electric.

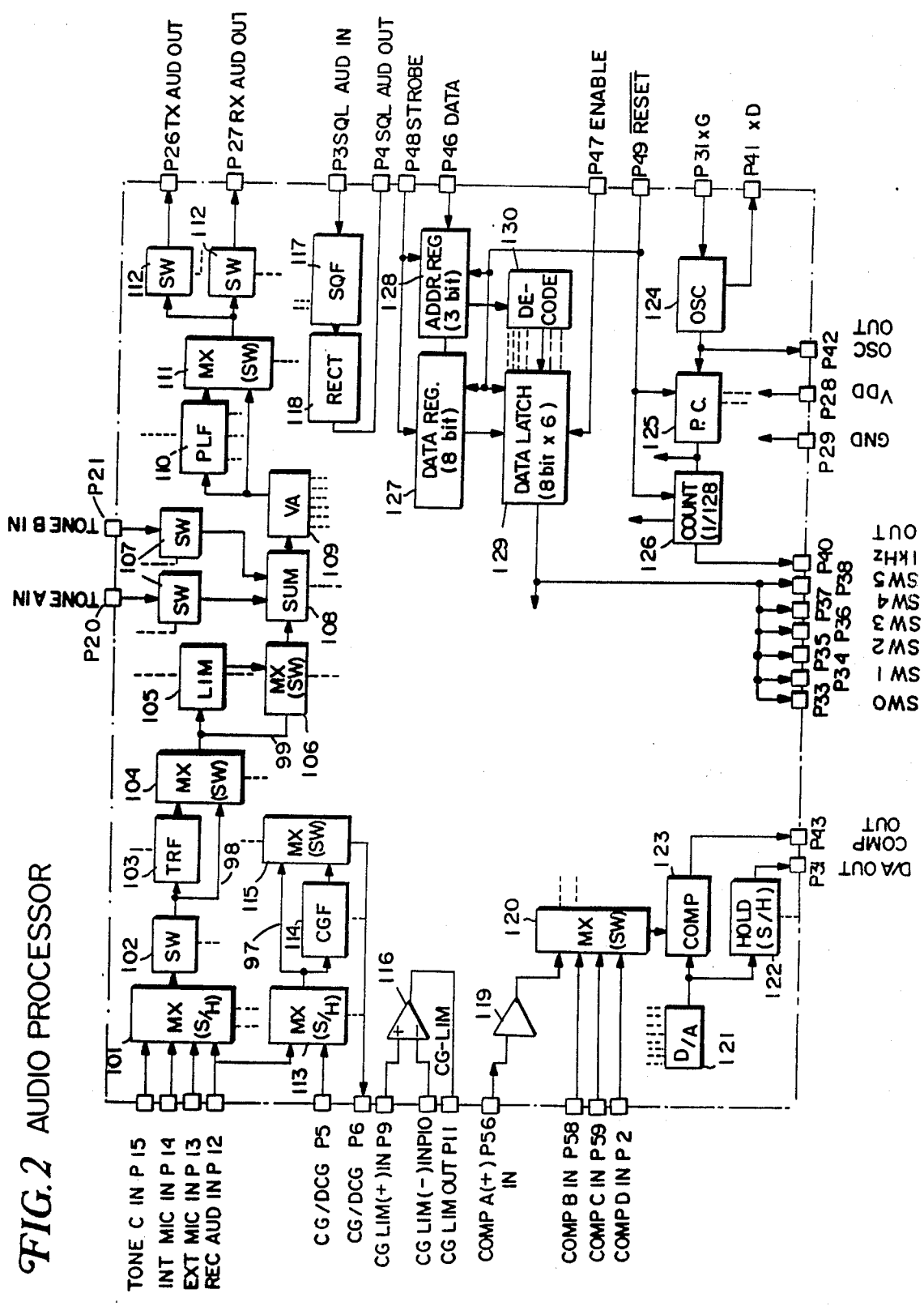
FIG. 2 AUDIO PROCESSOR

RADIO WITH DIGITALLY CONTROLLED AUDIO PROCESSOR

RELATED APPLICATION

This is a continuation-in-part of copending application Ser. No. 844,158, filed Mar. 26, 1986 now U.S. Pat. No. 4,870,699. This application is also related to application Ser. No. 039,245, entitled "Radio With Options Board", now U.S. Pat. No. 4,887,311 filed concurrently herewith.

FIELD OF THE INVENTION

This invention relates to a digitally-controlled, radio communication device. More particularly, the invention relates to a radio that includes a unique, integrated circuit audio processor having internal circuits whose operating characteristics are modified under microprocessor control. It is particularly suited to use in mobile and/or portable radio devices.

BACKGROUND AND SUMMARY OF THE INVENTION

The design of any mobile radio communication device must include certain control and audio circuits, e.g., conventional audio filters and control circuits. These circuits determine many of the basic operating features of the radio.

In the prior art, mobile radio designs have typically included discrete audio filters and control circuits. To alter the operation of such audio filters and control circuits requires hardware modifications to individual components or modules.

With the incorporation of microprocessor control in more recent mobile radio communication designs, some control functions may be altered by externally reprogramming the microprocessor's program memory. Unfortunately, the absence in the art of a digitally controllable audio system has prevented the use of such external programmability to readily modify such functions as audio bandwidth, tone filter response and squelch filter response. Instead, due to the constraints of prior art radio designs, internal hardware alterations have been necessary to provide desired modifications to these and other functions (such as RF power level, modulation level, squelch threshold level etc.).

The need for flexibly modifying the above-mentioned audio features is due in part to the crowded state of the RF spectrum. Thus, where FCC regulations require it, it may be necessary to use narrow band channels with lower RF power outputs. In this regard, although standard channels are spaced at 25 to 30 kilohertz increments, the FCC allows channels spaced at 12.5 kilohertz increments in certain locations. In order to keep the occupied spectrum within the FCC limits, it is necessary to alter the characteristics of certain filters within the radio audio circuitry.

As noted above, to alter such characteristics heretofore required hardware circuit modifications. More specifically, in prior art radio designs, to reduce the power output or to reduce the level of voice modulation or to adjust the squelch circuits required internal circuit component replacement.

The audio processor of the present invention allows for such features to be flexibly modified to suit the needs of specific user requirements. Advantageously, the present radio design incorporates such modifications by electrically altering the operation of system components to produce different operating characteristics without requiring hardware component changes.

The audio processor is advantageously implemented in the form of an integrated circuit which operates under the control of at least one microprocessor. The audio processor of the present invention provides basic transmit/receive audio filters, tone signaling filters, squelch filters, an RF power level control circuit, a DC voltage measuring circuit, a volume level adjusting circuit, and a transmit level adjusting circuit.

In the present invention, audio bandwidth, tone filter response, squelch filter response and other operating characteristics are adjusted by an incoming data bit stream from the controlling microprocessor. In addition, in response to data received from a microprocessor, the audio processor is controlled, for example, to have its receive audio path closed and its transmit audio path opened to switch from the receive to transmit mode. Based on digital control data received at predetermined input pins, the audio processor of the present invention has its filter responses, signal paths, and other characteristics altered in a predetermined manner to configure the audio processor to appropriately operate in the transmit and receive modes.

BRIEF DESCRIPTION OF THE DRAWINGS

These as well as other objects and advantages of this invention will be better appreciated by reading the following detailed description of a presently preferred exemplary embodiment taken in conjunction with the accompanying drawings of which:

FIG. 2 is a schematic diagram of an exemplary embodiment of the audio processor integrated circuit of the present invention.

DETAILED DESCRIPTION OF THE INVENTION

Figure 1:
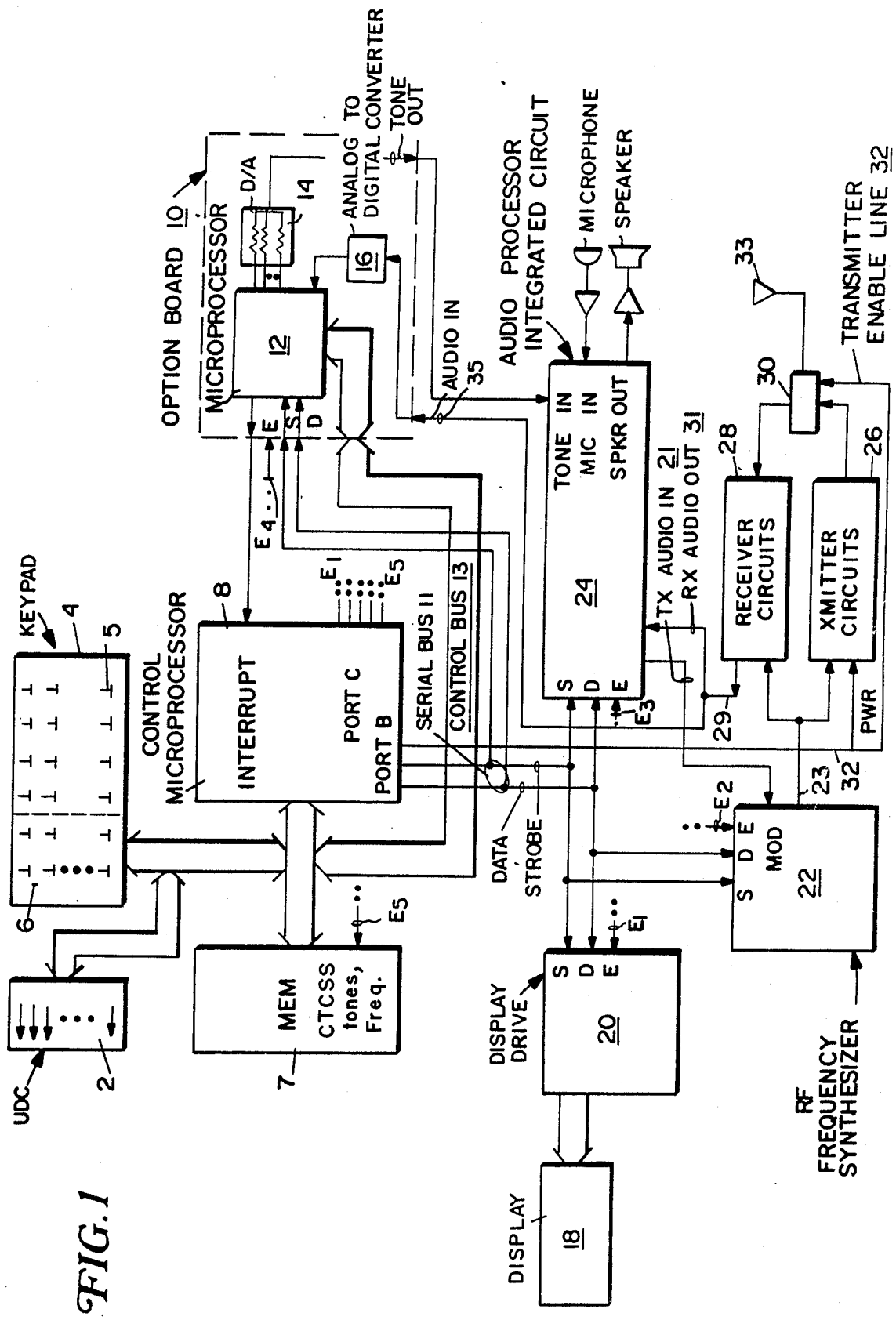
FIG. 1 is a schematic diagram of a portable mobile radio communication device which includes the audio processor of the present invention.

FIG. 1 discloses an exemplary mobile radio system in which the audio processor of the present invention may be advantageously utilized. While this radio system is described below, for further details, particularly those regarding the option board processor of this radio system, reference is made to the applicant's copending application entitled "Radio With Options Board", application Ser. No. 039,311 now U.S. Pat. No. 4,887,311 filed concurrently herewith. This application is expressly incorporated herein by reference.

Turning to the hardware elements of the radio system of FIG. 1, Universal Devices Connector (UDC) 2 comprises a set of contact pins on the side housing of the portable radio and permits the radio system circuit components to be interconnected with a wide range of external audio accessories. For example, a hand-held microphone or an earphone may be connected to the radio system via UDC 2. In addition, radio operating parameter data is loaded into RAM 7 through UDC 2.

Keypad 4 includes a set of control keys 6 and optional keys 5 which are repetitively scanned by the processors. Although these keys are schematically represented as being part of the same keypad, keys 5 and 6 may be located at independent locations on the radio housing. The control keys 6 activate the basic radio controls which are responded to by control microprocessor 8. The keys 6, for example, include the conventional volume up/down, channel up/down, push to talk (PTT) and home channel controls.

Keys 5 are associated with the expanded function capability provided by the option board 10. By way of example only, these switches may comprise 16 keys including 12 "Touch Tone" keys, each of which initiate the transmission of corresponding touch tone digit data to option board 10.

RAM 7 is dedicated to storing "personality" data. Personality data is customer dependent data which determines such radio operating parameters as the RF operating frequency, the CTCSS tones to be generated, etc. that are required to meet a customer's specific needs. The data is loaded in RAM 7 via an external device connected to UDC 2. The stored operating parameter data is transferred under software control to the FIG. 1 components to control operation of the radio system according to the customer's needs. RAM 7 may, for example, be a volatile memory provided with a battery backup or an erasable programmable read-only memory (EPROM).

Control microprocessor 8 is a single chip microcomputer, which may, for example, be a Hitachi HD6305. As is described in detail in the aforementioned copending application filed concurrently herewith, control microprocessor 8 operates in two basic control modes. In the standard control mode (where no option board is present), the control processor performs all the basic radio control functions. In the option mode, where an option board microprocessor is present, the main control processor receives commands from the option board microprocessor.

The control microprocessor 8 exercises control over the audio processor 24 of the present invention (as well as the other components of FIG. 1) during the execution of a set of routines which are described in detail in the copending application "Radio With Options Board", Ser. No. 07/039,331 now U.S. Pat. No. 4,877,311, filed concurrently herewith. During the execution of the power-up keyscan, receive, transmit, and UDC test routine described in detail in the above-identified application, control signals are transmitted to audio processor 24 which control its operation in a manner described in detail below. Reference is made to FIGS. 2-5 and the disclosure related thereto of this concurrently filed application for the details of these routines. This subject matter is hereby expressly incorporated by reference herein.

Upon power-up of the radio, the control microprocessor automatically senses whether the option board is present and takes appropriate action dependent on the sensed operating mode. More specifically, in the standard mode of operation, the control microprocessor monitors the control switches and performs the indicated tasks, i.e., channel up/down, volume up/down, push-to-talk, and channel monitor. Additionally, the control microprocessor 8 senses the presence of UDC devices connected to UDC 2 and takes appropriate actions, i.e., load/store personality data to RAM, switch audio circuits to external accessories, etc. The control microprocessor 8 also monitors and controls internal hardware, i.e., the display 18, audio processor 24, synthesizer 22, etc.

When an option board is plugged in and active, a control signal is sent from the option microprocessor 12 to the control microprocessor 8. This signal interrupts the control microprocessor's main program flow and a predescribed sequence of signals is exchanged over the serial bus between the control microprocessor and the option board, thereby causing the control microprocessor to acknowledge the presence of the option board and to prepare to accept instructions from the option board microprocessor.

As disclosed in the aforementioned concurrently filed application, the option board microprocessor 12 transfers executable code over the serial bus 11 into the internal RAM (not shown) of the control microprocessor 8. This code instructs the control microprocessor 8 to perform one of the basic control routines stored within its internal ROM (not shown). In this manner, the option board has access to all controllable hardware within the system, i.e. the frequency synthesizer, audio processor, display, data memory, UDC, and keyboard switches.

The option board microprocessor 12 may, for example, also be a Hitachi HD6305. In addition, the option board 10 includes an analog to digital converter 16 which receives the audio signal from receiver 28 on audio input line 35 to provide digital signals that the microprocessor 12 can process. The microprocessor 12 transmits output digital signals to digital to analog converter 14 which provides an analog output signal to the input of audio processor 24. The microprocessor 12 is connected to the control microprocessor 8 via control bus 13 and serial bus 11. Reference is made to FIGS. 6–8 and the disclosure related thereto of application Ser. No. 07/039,331, filed concurrently herewith for disclosure regarding the option microprocessor software. This subject matter is expressly incorporated by reference herein.

The audio processor 24 of the present invention may be controlled by either or both the control microprocessor 8 and the option microprocessor 12. As an example of interaction between the option board and the audio processor 24, it is noted that the option board may have the capability of generating tones via D/A converter 14 which are coupled to the audio processor's tone-in input shown in FIG. 1. Such a generated tone may be added with the microphone audio signal to modulate the transmitter as will be explained in detail below with respect to FIG. 2.

Such selective call encoding/decoding is typically performed due to the combined action of option microprocessor 12 and control microprocessor 8. In this regard, if "personality" data from RAM 7 indicates that selective call decoding is to be performed on a defined channel, control microprocessor 8 via control bus 13 informs the option microprocessor 12 to check the output of A/D 16 for a predetermined tone pattern. If such a tone pattern is detected, then the option board microprocessor 12 sends instructions over control bus 13 defining the operation the control processor 8 must perform in order to complete the selective call decoding process. In this regard, the control microprocessor 8 is instructed to open the audio circuits in the audio processor 24, to send an alert tone to inform the user that he/she has been paged, and to leave the audio circuit open to pass on the desired message.

Display 18 is a conventional liquid crystal display. The display 18 is driven by a serially controlled display drive 20 which may, for example, be a NEC 7225.

The RF frequency synthesizer 22 operates based on a single crystal which generates a frequency on the order of 13.2 megahertz. Based on data received from the control microprocessor serial bus 11, this basic frequency may be operated on (e.g., multiplied, divided) to generate a desired frequency on line 23 to drive the receiver 28 and transmitter 26.

As can be seen from FIG. 1, strobe and data lines are connected to the display driver 20, the audio processor 24, the RF frequency synthesizer 22 and the option board 10. These components also receive an enable input (E1 to E5) from control microprocessor port C, which identifies which device is targeted to receive the data then present on the data line. For example, for the audio processor 24 to receive the data, a strobe pulse must also be present. This strobe pulse clocks data into an interface register (not shown in FIG. 1) in one of the display drive 20, frequency synthesizer 22, audio processor 24, option board 10.

The transmitter circuits 26 and the receiver circuits 28 are conventional FM circuits which receive an RF carrier frequency on line 23 from synthesizer 22. The transmitter 26 also receives from audio processor 24 an audio input (from the transmitter audio input line 21) via the RF frequency synthesizer which serves to modulate the RF carrier. In addition, the transmitter 26 receives control signals via the transmitter enable line 32 from control microprocessor 8 which serves, for example, to power up the final transmitter amplifier stages. The receiver 28 generates an audio signal output on line 29.

Antenna switch 30 switches antenna 33 to either the transmitter 26 or the receiver 28 depending upon whether the radio is in the transmit or receive mode. The antenna switch position is controlled by the control signals that enable the transmitter on line 32. Thus, when the transmitter is enabled the antenna is switched to the transmitter and when the transmitter is not enabled the antenna will be switched to the receiver.

As mentioned above, audio processor 24 operates under microprocessor control and provides the audio filtering and shaping required in both the transmit and receive modes. In the transmit mode, the audio processor 24 filters, shapes and routes audio signals from the microphone input to the transmitter audio input line 21. Similarly, the audio processor 24 receives as an input the receiver audio output signals on line 31, processes and routes such signals to the speaker output of the audio processor.

An exemplary embodiment of the audio processor integrated circuit 24 is shown in FIG. 2. The integrated circuit, by way of example only, is implemented using CMOS digital, linear and switched capacitor filter technology. As will be understood by those skilled in the art, switched capacitor filter technology involves replacing the resistors in the more typical RC filter circuit with switches that are opened and closed at a predetermined frequency. By such switching, the capacitors in the filter circuits are charged and discharged via switches rather than through resistors. Switched capacitor filter technology is used in the present implementation to overcome the difficulties in accurately controlling the value of resistors in integrated circuits. In this regard, switched capacitor filter circuits are easier to accurately fabricate due in part to the precision with which the switches may be controllably switched. In addition, the accurate fabrication of switched capacitor circuits is dependent on the ratio of capacitors utilized rather than the absolute value of any single capacitor. Nevertheless, it should be understood that the audio processor 24 of the present invention may be implemented in other than switched capacitor filter technology.

Turning to the FIG. 2 integrated circuit, the processor's transmit and receive audio paths share a significant amount of common circuitry. In both the transmit and receive modes, an input audio signal enters on one of the pins P12 through P15 and an output audio signal exits on either pin P26 or P27.

Input multiplexer 101 selects one of the four possible inputs which are supplied to the audio processor at pins P12-15. In the transmit mode, an internal microphone input (for the mic. shown in FIG. 1) or an external microphone input (from UDC 2) may be received on pins P13 or P14, respectively. In addition, a tone input is provided as an auxiliary input for future optional use on pin P15. The tone input, as will be discussed further below, may be utilized to transmit an alert tone. In the receive mode, the unfiltered receiver audio output from line 29 of FIG. 1 is transmitted to the receiver audio input at pin P12.

The multiplexer 101, like many of the audio processor components, is controlled in a unique manner. As reflected by the two dotted lines entering the lower portion of the multiplexer 101, two control signals are transmitted thereto to select any one of these four signals input on pins P12-15. The control signals may be transmitted to the audio processor 24 from control microprocessor 8 or option processor 12 and are stored in data latch 129 in a manner which will be described below. It is noted that each of the components in the audio processor (as indicated in FIG. 2) are appropriately provided with control signals which control the components operation. It is further noted that data latch 129 is implemented by six 8 bit registers and thus serves to generate forty-eight separate control signals.

Switch 102 receives the selected input from pins P12 through P15 and also receives a control input. Thus, the switch 102 may be controllably opened to disable all of these audio inputs. In this regard, it is noted that it may be desirable to disable such inputs when tones are to be transmitted via tone A or tone B inputs on pins P20 and P21 when no voice transmission is desired.

When the audio processor is used in conjunction with option board 10 shown in FIG. 1, the tone A or tone B input may be transmitted from the option board. Alternatively, in a standard radio which does not have the option board continuous tone controlled squelch (CTCSS) signals may also be input on either pins P20 or P21 in a manner which will be discussed in detail below.

Turning back to the output of switch 102, if the switch is closed, then the selected input signal is transmitted to tone reject filter (TRF) 103. The tone reject filter 103 is used in the receive mode to remove low frequency (e.g., CTCSS) tones from the audio signal so they won't be heard at the speaker output (see the audio processor speaker in FIG. 1).

The tone reject filter 103 (like many of the audio processor components) is used for dual purposes dependent upon the current mode of operation. In this regard, in the receive mode, the output from receiver 28 may have both voice components and low frequency (CTCSS) components. To eliminate the CTCSS tone from being audible at the speaker, filter 103 serves as a high pass filter. In the transmit mode, filter 103 is used to remove low frequency voice components that might interfere with the CTCSS signaling. The control signal to multiplexer 104 selects whether the tone reject filter is bypassed via line 98 or the filtered signal is selected by multiplexer 104.

The output of multiplexer 104 is coupled to the input of limiter 105. Limiter 105 is utilized in the transmit mode only and provides modulation limiting as required by EIA Specifications and FCC regulations. This limiter insures that only the prescribed amount of transmitter carrier deviation is provided by limiting the peak amplitude swings in the microphone input.

In the receive mode, the limiter 105 is bypassed by virtue of line 99 and multiplexer 106. Thus, during the transmit operation an enabling control signal is transmitted to multiplexer 104, whereas in the receive operation, a limiter bypassing control signal is transmitted from control microprocessor 8 to multiplexer 106.

The output of multiplexer 106 is transmitted to summing amplifier 108. In the transmit mode, this amplifier adds the signaling tones from inputs P20 and P21 to the audio signals passed by multiplexer 106. The control signals applied to the switches at 107 will govern whether a tone is applied or not applied. By virtue of summing amplifier 108, if desired, a voice and low frequency tone composite signal may be transmitted. In the receive mode, the summing amplifier may be utilized to add alert tones to the received signal.

The output of the summing amplifier 108 is coupled to the input of variable or programmable attenuator 109. The programmable attenuator 109 provides a mechanism for adjusting the modulation level in the transmit mode and the volume control in the receive mode.

The programmable attenuator 109 has six control inputs. Five of these control inputs are utilized to define the desired modulation level or volume control level and the sixth control input defines whether the radio is in the transmit mode or the receive mode. Thus, by virtue of signals sent from microprocessors 8 or 12, the attenuator 109 may have its operating characteristics altered to, for example, control the level of modulation from approximately five kilohertz to approximately two and one half kilohertz. For a detailed discussion of the operation of the audio processor's programmable attenuator and the manner in which the programmable attenuator is controlled, referenced is made to copending application Ser. No. 844,158, which application is hereby expressly incorporated by reference.

When operating in the transmit mode, the output of variable attenuator 109 is coupled to the input of post limiter filter 110. The post limiter filter provides the guaranteed maximum spectral occupancy required by the FCC. Stated otherwise, post limiter filter 110 is designed such that no frequency components go beyond 3,000 hertz for normal applications or 2,500 hertz for narrow band use. The post limiter filter 110 receives a control signal input which indicates whether its frequency range is for normal or narrow band application. In the receive mode, the post limiter filter improves noise performance.

In applications where high frequency data is being transmitted, multiplexer 111 provides a means to switch around the post limiter filter 110. Thus, with multiplexer 111, if desired, high frequency data can be input on pins P20 and P21 to modulate the transmitter.

The switches 112 at the output of multiplexer 111 each have a control input and are utilized to enable or disable the transmit or receive audio outputs dependent upon whether the radio is in the transmit mode or the receive mode. The transmitter audio output at pin P26 is transmitted to the modulation input of the RF frequency synthesizer 22 (FIG. 1). The receiver audio output at pin P27 is transmitted to the receiver's audio amplifier which is turned on and off by one of the output pins P33-38 in a manner to be described below.

In the discussion of, for example, the aforementioned flowcharts in the copending application filed concurrently herewith, when it is mentioned that the audio paths are closed, this function may simply be accomplished by microprocessors 8 or 12 generating a control signal which appropriately closes switches 112. Likewise, the audio path may be controllably opened by appropriately enabling switches 102, 107 and 112.

The channel guard or CTCSS related pins P5 and P6 are used in conjunction with the tone-in pin P20. It is noted that the CTCSS signaling is a technique by which a receiver squelch circuit may be selectively opened in response to a low frequency tone. Thus, different tones may be utilized to open different receivers to enable a user transmitter to selectively cause only certain receivers to open depending upon the generated tone. Thus, to use this signaling option, in the transmit path a low frequency tone must be added (e.g., via summing amp 108).

In the standard radio configuration, control microprocessor 8 generates the CTCSS signals by generating a stair-step waveform that approximates a sine wave. Pin P5 receives this waveform, which is generated by connecting each of two lines from microprocessor 8 to a resistor. The resistors are tied together and are connected to pin P5. If selected by multiplexer 113, the digitally generated tone waveform is passed to low pass channel guard filter 114 to remove high frequency clock components. In the receive mode, the tone low pass filter provides filtering for low frequency signaling tone applications and removes voice and high frequency clock components as required. Multiplexer 115 and line 97 allow the tone output to bypass filter 114 for signaling applications which use tones higher than 250 hertz. This processing results in a sine wave having reduced harmonic distortion. In the transmit mode, this signal is output on pin P6 and immediately fed to tone-in pin P20 and then to summing amplifier 108.

In the receive mode, a tone decoder must be present in the receive path for detecting the presence of the predetermined tone frequency. Thus, while in the transmit mode, multiplexer 113 under the control of its control signal selects the encoded channel guard signal from pin P5. In the receive mode, multiplexer 113 selects the signal from receive audio input pin P12 and passes the audio input signal to the channel guard filter 114. The low pass channel guard filter 114 allows the low frequency signaling tones to pass, but blocks the higher frequency voice components which are also present.

In the receive mode, the voice components are removed so that the signal can be checked to determined whether the required tone is present. In this mode, the output of channel guard filter 114 is transmitted through the multiplexer 115 to the channel guard limiter 116 via pin Pg. The channel guard tone limiter 116 (which receives a biasing input at pin P10) converts the analog tone signal to digital levels for processing by control microprocessor 8. The output digital signal from limiter 116 is transmitted out pin P11 to the control microprocessor 8 which determines whether the received tone has the required frequency to open up the receiver.

The audio microprocessor 12 (FIG. 1) also allows for the external programming of squelch filter response. The squelch audio input 3 receives, as does pin P12, the receiver 28 audio output. The squelch filter 117 is a high pass filter that determines the presence of high frequency noise, thereby indicating that an RF carrier is not present. The absence of a RF carrier indicates that the receiver should be squelched so the user does not have to listen to the output noise.

The squelch filter response is selectable from 4,500 hertz to 7,500 hertz to allow the audio processor 24 to be used with receiver designs having different noise output characteristics. The two control inputs shown in FIG. 2 permit the response to be selected at four different points within this range.

The filtered squelch noise is coupled to amplifier rectifier 118 which converts the filtered squelched noise to a DC level for comparison to a preset squelch threshold. This rectified signal is transmitted out pin P4, passed through a low pass filter (not shown) to eliminate high frequency noise, and thereafter the essentially DC signal is input to the audio processor's DC amplifier 119 at pin P56. Amplifier 119 amplifies the squelch output level before the threshold comparison.

The output of amplifier 119 is then applied to one of four inputs to multiplexer 120. Multiplexer 120 selects one of these four inputs and compares the selected input to a predetermined threshold. In addition to a comparison with a predetermined squelch threshold, other threshold comparisons may be made. For example, a battery voltage level measurement may likewise be compared with a battery voltage level threshold.

Presuming that the squelch signal from DC amp 119 is selected by multiplexer 120 (as determined by its two control inputs), the squelch signal is then fed to a first input of comparator 123. The second input of comparator 123 then receives the predetermined squelch threshold via digital to analog (D/A) converter 121.

Digital to analog converter 121 receives an 8 bit digital word from microprocessor 8 and provides an analog DC level output. This output besides being utilized as a reference for making DC comparisons, may also be used, for example, for setting the radio frequency output power level via sample/hold (S/H) circuit 122 and pin P31.

When determining whether a carrier is present, the D/A converter 121 is set with a predetermined DC level indicative of a squelch threshold. The output of comparator 123 indicates whether the output of DC amplifier 119 is above or below the squelch threshold and hence, whether or not the audio path to the speaker should be opened. Thus, the comparator output on pin P43 is transferred back to control microprocessor 8 in order for it to determine whether the audio path to the speaker should be opened.

In regard to the other inputs of multiplexer 120, the comparator B input at pin P58 is utilized to input the battery voltage of the system. When a battery level voltage measurement is made, the D/A converter 121 is loaded with a digital word indicative of a battery voltage threshold. The output of comparator 123 then indicates whether the current battery voltage is above or below the threshold. This signal is likewise sent to microprocessor 8 which provides a signal to display 18 if the battery level is low. In addition, an audible alarm may be generated to indicate a low battery condition.

The comparator C input pin P59 is presently used as a spare input to be incorporated for further comparisons as the need arises. The comparator D input at pin P2 is utilized to measure the voltage at can determine the type of device which is then connected to the radio system via UDC 2 as determined by the execution of a UDC test routine.

Sample and hold circuit 122 provides a stable DC output from D/A converter 121. The sample and hold output is transmitted via pin P31, in the transmit mode, to set the voltage in the RF section of the radio to control the RF power output. Thus, by virtue of D/A converter 121 and sample and hold circuit 122, the RF power can be programmed according to the requirements of predetermined channels. Accordingly, a different digital word can be loaded into D/A converter 121 for any desired channel to produce a different output voltage at pin P31 which will result in a different RF output power for that channel. By virtue of the sample and hold circuit 122, the D/A converter 121 can rapidly output the signal indicative of a RF power level to S/H 122, which provides a stable DC output. Immediately thereafter, A/D converter 121 may be loaded with a different eight bit word indicative, for example, of a battery level voltage level threshold.

Turning next to the registers and the related components which deliver the digital control signals to the audio processor components, as indicated above, these digital control signals are transmitted from microprocessor 8 via the data, strobe and enable lines (pins P46, P48, P47). Data is provided to the audio processor on pin P46. This data is clocked (via signals from pin P48) into an eleven bit register consisting of a data register 127 and an address register 128.

Data register 127 receives and stores an eight bit data word received via serial bus 11. The three address bits transmitted via serial bus 11 to address register 128 are decoded by decoder 130 to determine which of the six data latches of register 129 is to receive the eight bit data word temporarily stored in register 127.

The data latch 129 includes 48 independent outputs. Each of these outputs is assigned to an audio processor component. As will be readily understood by those skilled in the art, control signals are then conventionally routed to provide the appropriate control signals to the audio processor component's control input(s).

Oscillator 124, programmable counter 125 and divider 126 provide the necessary clock signals for the audio processor circuitry. For example, oscillator 124 is utilized to generate the clock signals to drive the audio processor's switched capacitor filter circuits. In addition, the output of oscillator 124 via pin P42 is utilized to provide clock frequency signals for the other components in the radio system including microprocessors 8 and 12. The programmable counter 125 allows for the selection of one of four possible divide ratios so that the external crystal connected across pins P41 and P31 may be programmed to provide any one of four frequencies. Thus, the programmable counter 125 provides the audio processor 24 with enhanced frequency generating flexibility notwithstanding the external crystal frequency utilized. Counter 126 is a frequency divider which provides a one kilohertz output alert tone via pin P40. For example, in the receive mode, such an output may be fed to the tone C input pin P15 to provide a tone in the speaker whenever the user actuates a key.

Pins P33 through P38 are outputs from the data latch that are used to controllably switch on or off external devices in the system under the control of microprocessor 8. For example, one of the output pins P33 through P38 may be used to turn on the receiver's audio amplifier during the time frame that a carrier's presence is detected. When the carrier's presence is no longer present, then the data latch output to such a pin is reset over the control microprocessor's serial bus through reset pin P49. Besides providing power to the audio amplifier, the output from pins P33-38 may be similarly used to provide power to an external device connected to UDC 2. In addition, pins P28 and P29 are power supply and ground pins, respectively.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A digitally-controlled radio communication transceiver including:
    RF means for transmitting radio frequency signals in a transmit mode and for receiving radio frequency signals in a receive mode;
    digital processor means coupled to said RF means for performing radio control functions in said transmit and receive modes and for generating digital control signals; and
    an audio signal processor means, connected to said RF means and responsive to said digital control signals, for processing, in analog form, audio signals applied thereto in both the transmit and receive operating modes, said audio signal processor means including a common analog audio signal processing path shared by audio signals processed in the transmit mode and audio signals processed in the receive mode;
    wherein said audio signal processor means comprises an integrated circuit, and wherein said common signal processing path includes:
        input means for receiving a plurality of different input audio signals;
        selecting means for selecting one of said plurality of input audio signals; and
        filtering means operable in both the transmit and receive modes for filtering the selected audio signal,
    said audio signal processor means further including control means connected to said selecting means and said filtering means and responsive to said digital control signals for controlling said selecting means and said filtering means.

2. A radio communication transceiver according to claim 1, wherein:
    said transceiver includes microphone means for producing audio signals;
    said RF means includes detector means for providing a received audio signal responsive to received RF signals; and
    said audio signal processor means includes
    pin means for receiving said audio signals produced by said microphone means, and
    an audio input connected to receive said received audio signal provided by said detector means.

3. A radio communication transceiver according to claim 2, wherein said filtering means includes low pass means, responsive to said control means and operable in said receive mode, for removing low frequency tones from the received audio signal; and
    means responsive to said control means operable in the transmit mode, to remove predetermined voice components from the audio signals produced by said microphone means.

4. A radio communication transceiver according to claim 1, wherein said selecting means includes multiplexer means responsive to said control means for selecting one of said plurality of input audio signals.

5. A radio communication transceiver according to claim 1, wherein:
    said common signal processing path further includes limiting means, coupled to said filtering means and operable only in said transmit mode, for limiting the peak amplitude swings in said selected input audio signal,
    and means operable in said receive mode and connected to said limiting means, for receiving the output of said means for filtering and for selectively bypassing said limiting means.

6. A radio communication transceiver according to claim 1, wherein:
    said transceiver further includes tone generating means for supplying a predetermined tone input signal; and
    said common signal processing path includes means responsive to said control means for selectively combining said tone input signal with the filtered selected audio signal to generate a composite audio signal.

7. A radio communication transceiver according to claim 6, wherein:
    said audio signal processor means further includes means for receiving and processing continuous tone controlled squelch signals;
    said continuous tone controlled squelch signals being coupled to said tone generating means.

8. A radio communications transceiver according to claim 6, wherein:
    said RF means includes means for modulating said transmitted radio signals;
    said transceiver further includes means for providing an audio output signals responsive to said received RF signals;
    said common signal processing path further includes programmable attenuator means, responsive to said composite signal and to said digital control signals, for selectively adjusting the level of modulation of said transmitted radio signals in the transmit mode and the level of said audio output signal in the receive mode.

9. A radio communication transceiver according to claim 8, wherein said programmable attenuator means includes a plurality of digital control inputs for receiving signals defining one of the modulation level and the audio output signal level, and for receiving a control input defining whether the transceiver is currently operating in the transmit mode or the receive mode.

10. A radio communication transceiver according to claim 9, said common signal processing path including means, operable in both said transmit and receive mode, for filtering the output of said programmable attenuator means.

11. A radio communication transceiver according to claim 1, wherein said common signal path further includes switch means, responsive to said digital control signals, for selectively opening or closing said signal path.

12. A radio communication transceiver according to claim 1, wherein:

said RF means includes means for providing an audio output signal responsive to received RF signals and means for modulating said transmitted RF signals in response to an audio input signal;

said transceiver includes speaker means for converting audio signals to acoustical signals; and said common signal processing path includes:

means connected to receiver said audio input signal and said audio output signal, output means for coupling said audio input signal to said RF means and for coupling said audio output signal signal to said speaker means; and switch means connected to said output means for alternately disabling the coupling of said audio input signal to said RF means and disabling the coupling of said audio output signal to said speaker means.

13. A digitally controlled radio communication device including:

digital processor means for performing radio control functions and for generating digital control signals;

RF means connected to said digital processor means for alternately transmitting and receiving RF signals in response to said control signals;

audio processor means for processing analog audio signals applied thereto in accordance with certain analog operating characteristics; and control means, responsive to said digital control signals and connected to said audio processor means, for dynamically altering the audio processor means certain operating characteristics in response to whether said RF means is transmitting or receiving said RF signals, wherein:

said audio processor further includes programmable attenuator means for attenuating a signal supplied thereto;

means connected to receive input audio signals for processing said received audio signals and for applying said audio signals to said programmable attenuator means;

said control means is connected to control said programmable attenuator means and includes means responsive to said digital control signals for controlling the attenuation provided by said programmable attenuator;

said RF means includes modulating means for modulating said transmitted RF signal in response to an audio input signal applied thereto;

said device further includes analog audio amplifier means for amplifying audio signals responsive to said received RF signal to provide an audio output signal; and said programmable attenuator means connected to control the level of said modulation when said RF means is transmitting and the level of said audio output signal when said RF means is receiving.

14. A digitally controlled radio communication device according to claim 13, wherein said audio processor means comprises an integrated circuit having a plurality of internal components, and wherein said control means includes means for storing said digital control signals and for distributing said control signals to said plurality of components.

15. A digitally connected radio communication device according to claim 14, wherein said means for storing includes:

a plurality of registers each storing multiple bits, each bit providing an independent control signal; and means for selectively loading at least one of said plurality of multibit registers.

16. A digitally controlled radio communication device according to claim 13, wherein:

said audio processor means further includes means connected to receive a plurality of input audio signals for selecting one of said plurality of input audio signals;

filter means connected to said selecting means for filtering said selected one of said audio signals; and said control means is connected to control said filter means and includes means, responsive to said control signals, for selectively modifying the operating characteristic of said filter means.

17. A digitally controlled radio communication device according to claim 16, further including means for operating in transmit or receive mode, and wherein said means for filtering includes means, responsive to one of said control signals and operable in said receive mode, to remove low frequency tones from the received audio signal; and means, responsive to one of said control signals and operable in the transmit mode, to remove predetermined voice components from the audio signal applied thereto.

18. A digitally controlled radio communications device according to claim 13, wherein:

said audio processor means including means for performing any one of a plurality of parameter threshold comparisons; and said control means includes means, responsive to said digital control signals, for selecting a predetermined parameter;

wherein said means for performing including comparing means for comparing said selected parameter with a predetermined threshold level.

19. A digitally controlled radio communication device according to claim 18, further including means, responsive to said comparing means, for controlling the operating characteristics of said radio.

20. A digitally controlled radio communication device according to claim 19, wherein said selected parameter is a supply voltage level.

21. A digitally controlled radio communications device according to claim 20, wherein:

said radio device further includes a battery; and said supply voltage level is the battery voltage level.

22. A digitally controlled radio communications device according to claim 13, wherein:

said audio processor means further includes digital to analog converter means for generating predetermined analog signals in response to received digital signals;

said control means includes means for supplying said digital signals to said digital to analog converter means; and said audio processor means further includes means connected to receive said generated analog signals for controlling the operating characteristics of said radio device based on said generated analog signals.

23. A digitally controlled radio communications device according to claim 22, wherein said means for controlling including means for setting the radio frequency output power level.

24. A digitally controlled radio communications device according to claim 22, further including means for comparing a generated analog signal with a squelch indicating signal; and
    means, responsive to said means for comparing, for determining whether a radio frequency carrier signal is present and for opening the receiver audio paths if a carrier is detected.

25. A digitally controlled radio communications device according to claim 22, further including sample and hold means, coupled to the output of said digital to analog converter means, for temporarily storing the output of said converter means.

26. A digitally controlled radio communications device according to claim 13, wherein:
    said audio processor means further includes frequency generating means for providing clocking signals to at least components within said audio processor means; and
    said control means includes means connected to the frequency generating means for selectively programming the frequency of said clocking signals in response to said digital control signals.

27. A digitally controlled radio communications device according to claim 26, wherein said frequency generating means includes means for generating clock signals for said digital processor means.

28. A digitally controlled radio communication device including:
    digital processor means for performing radio control functions and for generating digital control signals;
    RF means connected to said digital processor means for alternately transmitting and receiving RF signals in response to said control signals;
    audio processor means for processing audio signals applied thereto in accordance with certain operating characteristics;
    control means, responsive to said digital control signals and connected to said audio processor means, for dynamically altering the audio processor means certain operating characteristics in response to whether said RF means is transmitting or receiving said RF signals;
    an audio output terminal;
    squelch filter and processing means connected to said RF means for determining the presence of a radio frequency carrier;
    programmable reference means connected to receive said control signals for generating a threshold the level of which is responsive to said control signals;
    means for comparing the output of said squelch filtering and processing means with the threshold to detect whether a radio frequency carrier is being received by said RF means; and
    means connected to said comparing means for providing an audio signal responsive to said received RF signal to said audio output terminal in response to said radio frequency carrier detection.

29. In a digitally controlled radio communications device having:
    (a) a digital processor means, and
    (b) audio processor means, coupled to said digital processor means, for processing audio signals applied thereto, wherein said communication device includes means for operating in the transmit and receive modes and said audio processor means includes programmable attenuator means,
a method of controlling said radio communication device comprising the steps of:
    (i) performing a plurality of radio control functions and generating digital control signals with said digital processor means;
    (ii) processing audio signals applied to said audio processor means in analog form in accordance with certain operating characteristics;
    (iii) altering the audio processor means operating characteristics in a predetermined manner in response to said digital control signals;
    receiving input audio signals, processing said received audio signals; and
    applying said audio signals to said programmable attenuator means;
    said altering step being responsive to said digital control signals and including the step of controlling said programmable attenuator means to provide one operating characteristic in the transmit mode and another operating characteristic in the receive mode.

30. A method according to claim 29, wherein said altering step (iii) includes the steps of storing said digital control signals and distributing said control signals to a plurality of components within said audio processor means.

31. A method according to claim 29, further including the steps of:
    receiving a plurality of input audio signals with said audio processor means;
    filtering a selected one of said audio signals using certain programmable filter characteristics; and
    selectively modifying the filtering characteristics responsive to said control signals.

32. A method according to claim 31, wherein:
    said filtering step includes removing low frequency tones from the received audio signals; and
    said method further includes:
    receiving RF signals and producing received audio signals responsive thereto;
    transmitting RF signals and modulating said transmitted RF signals with audio input signals; and
    removing predetermined voice components from the audio input signals.

33. A method according to claim 29, further including the step of controlling the modulation level of the programmable attenuator in the transmit mode and the volume level of said attenuator in the receive mode.

34. A method according to claim 29, further including the steps of filtering and processing a received audio signal to generate a squelch signal for determining the presence of a radio frequency carrier;
    generating at least one predetermined threshold;
    comparing the squelch signal with said predetermined threshold to determine whether a carrier is present; and
    opening the receiver audio paths in response to a detected radio frequency carrier.

35. A method according to claim 29, further including performing any one of a plurality of parameter threshold comparisons; said altering step including selecting a predetermined parameter in response to a predetermined one of said digital control signals;
    said performing step including comparing said selected parameter with a predetermined threshold level.

36. A method according to claim 35, further including controlling the operating characteristics of said radio in response to said comparing step.

37. A method according to claim 36, wherein said selected parameter relates to a voltage level measurement.

38. A method according to claim 37, wherein said radio device includes a battery and said voltage level is the battery voltage level.

39. A method according to claim 29, further including
generating predetermined analog signals in response to received digital signals by a digital to analog convertermeans;
said altering step including supplying said digital signals to said digital to analog converter means; and
controlling the operating characteristics of said radio based on said generated analog signals.

40. A method according to claim 39, wherein said controlling step includes setting the radio frequency output power level.

41. A method according to claim 39, further including the step of temporarily storing a first generated analog signal; and supplying further digital signals to be converted in response to the temporary storage of said first generated analog signal.

42. A method according to claim 29, wherein said audio processor means including frequency generating means, said method including the steps of providing clocking signals to at least components within said audio processor means; and wherein altering step includes selectively programming, in response to said digital control signals, the frequency generating means to generate signals having a predetermined frequency.

43. A method according to claim 42, using said frequency generating means to generate clock signals for said digital processor means.

44. A method of operating a digitally-controlled radio communication transceiver including the steps of:
transmitting radio frequency signals in a transit mode and receiving radio frequency signals in a receive mode;
modulating said transmitted radio frequency signals with an analog audio input signal in said transmit mode;
demodulating said received radio frequency signals to provide output analog audio signals in said receive mode;
performing radio control functions and generating a plurality of digital control signals with a digital processor means;
alternately processing said audio input signals in analog form and said audio output signals in analog form with an analog audio processor coupled to said digital processor means, including sharing a common analog audio signal processing path within said audio processor by audio signals processed in the transmit and receive modes; and
simultaneously with said alternately processing step, processing channel guard signals with said same audio processor.

45. A digitally programmable audio signal processor for use in a digital radio transceiver of the type including:
(a) RF transmitting means for transmitting a radio frequency signal and for modulating said transmitted radio frequency signal in response to an audio input signal,
(b) RF receiving means for receiving a modulated radio frequency signal and for demodulating said received signal to provide a responsive audio output signal,
(c) digital signal processing means for providing a sequence of digital control signals, and
(d) digital frequency synthesizer means connected to said RF transmitting means and said RF receiving means and to said digital signal processing means for controlling the transmitting frequency of said radio frequency signal transmitted by said RF transmitting means and for controlling the receive frequency of said radio frequency signal received by said RF receiving means in response to said digital control signals,
said audio signal processor for connection to receive said digital control signals, said audio signal processor comprising:
programmable squelch noise detector means connected to said receiving means and to said control signals for muting said audio output signal whenever a carrier signal is not being received by said receiving means, said noise detector means including:
programmable frequency filter means connected to receive said audio output signal for filtering at least one frequency band from said audio output signal and for adjusting the width of said frequency band according to said receiving frequency in response to said digital control signals.

46. A programmable audio signal processor as in claim 45 wherein said noise detector means further includes:
programmable reference level generating means for generating a reference level according to said receiving frequency in response to said digital control signals; and
means connected to said filter means and to said programmable reference level generating means for comparing the level of said filtered audio output signal to said reference level and for muting said audio output signal if said comparison reveals said filtered audio output signal level exceeds said reference level.

47. A digitally programmable audio signal processor for use in a digital radio transceiver of the type including:
(a) RF transmitting means for transmitting a radio frequency signal and for modulating said transmitted radio frequency signal in response to an audio input signal,
(b) RF receiving means for receiving a modulated radio frequency signal and for demodulating said received signal to provide a responsive audio output signal,
(c) digital signal processing means for providing a sequence of digital control signals, and
(d) digital frequency synthesizer means connected to said RF transmitting means and said RF receiving means and to said digital signal processing means for controlling the transmitting frequency of said radio frequency signal transmitted by said RF transmitting means and for controlling the receive frequency of said radio frequency signal received by said RF receiving means in response to said digital control signals,
said audio signal processor for connection to receive said digital control signals, said audio signal processor comprising:

programmable squelch noise detector means connected to said receiving means and to said control signals for muting said audio output signal whenever a carrier signal is not being received by said receiving means, said noise detector means including:
  programmable reference level generating means for generating a reference level according to said receiving frequency in response to said digital control signals; and
  means connected to said programmable reference level generating means for comparing the level of said audio output signal to said reference level and for muting said audio output signal if said comparison reveals said audio output signal level exceeds said reference level.

48. A digitally programmable audio signal processor for use in a digital radio transceiver of the type including:
  (a) RF transmitting means for transmitting a radio frequency signal and for modulating said transmitted radio frequency signal in response to an audio input signal,
  (b) RF receiving means for receiving a modulated radio frequency signal and for demodulating said received signal to provide a responsive audio output signal,
  (c) digital signal processing means for providing a sequence of digital control signals, and
  (d) digital frequency synthesizer means connected to said RF transmitting means and said RF receiving means and to said digital signal processing means for controlling the transmitting frequency of said radio frequency signal transmitted by said RF transmitting means and for controlling the receive frequency of said radio frequency signal received by said RF receiving means in response to said digital control signals,
  said audio signal processor for connection to receive said digital control signals, said audio signal processor comprising:
  programmable filter means connected alternately to said audio output signal and to said audio input signal, for (i) removing signaling tones from said audio output signal, and (ii) removing low frequency voice components from said audio input signal.

49. A digitally programmable audio signal processor chip for use in a digital radio transceiver of the type including:
  (a) RF transmitting means for transmitting a radio frequency signal on a variable programmable transmit frequency and for modulating said transmitted radio frequency signal in response to an audio input signal,
  (b) RF receiving means for receiving a modulated radio frequency signal on a variable programmable receive frequency and for demodulating said received signal to provide a responsive audio output signal, and
  (c) battery power supply means for providing a power supply voltage,
  said audio signal processor chip comprising:
  programmable audio processing means operatively connected to said transmitting means and said receiving means for alternately processing said audio input signal and said audio output signal in accordance with preset audio processing parameters and for adjusting said preset parameters in response to said programmable transmit and receive frequencies; and
  power supply voltage testing means connected to said battery power supply means for comparing said power supply voltage with a preprogrammed reference level and for producing an output signal indicating the results of said comparison.

50. A digitally programmable audio signal processor chip for use in a digital radio transceiver of the type including:
  (a) RF transmitting means for transmitting a radio frequency signal on a variable programmable transmit frequency and for modulating said transmitted radio frequency signal in response to an audio input signal,
  (b) RF receiving means for receiving a modulated radio frequency signal on a variable programmable receive operating frequency and for demodulating said received signal to provide a responsive audio output signal, and
  (c) option board connecting means for connecting to an optional circuit board, said optional circuit board providing a presence indicating signal to said connecting means whenever said option board is connected to said connecting means,
  said audio signal processor chip comprising:
  programmable audio processing means operatively connected to said transmitting means and said receiving means for alternately processing said audio input signal and said audio output signal in accordance with preset audio processing parameters and for adjusting said preset parameters in response to said programmable transmit and receive frequencies; and
  option board presence testing means connected to said option board connecting means for sensing for the presence of said presence indicating signal and for producing an output signal when said testing means senses the presence of said presence indicating signal.

51. An integrated circuit audio signal processor for connection to a digital communications transceiver of the type which alternately operates in the transmit mode and in the receive mode and includes an RF transmitter having an audio input terminal, an RF receiver having an audio output terminal, an audio amplifier having an audio input terminal, and an audio signal source having a terminal, said audio signal processor comprising:
  audio signal multiplexing means (101) for selecting a received audio signal provided at said receiver audio output terminal in said receive mode and for selecting a further audio signal to be transmitted provided at said audio signal source terminal in said transmit mode;
  tone reject filter means (103) connected to said audio signal multiplexing means for selectively removing low frequency components from said selected audio signal;
  limiting means (105) connected to said tone reject filter means for amplitude limiting said filtered audio signal in said transmit mode;
  tone injecting means (107, 108) connected to said limiting means for selectively injecting signalling tones or data into said selected audio signal in said transmit mode;

digitally programmable attenuator means (109) connected to said tone injecting means for adjusting the amplitude of said selected audio signal to provide a desired level of transmitter modulation in said transmit mode and for adjusting the amplitude of said selected audio signal to provide a desired audio amplifier output level in said receive mode;

post limiter field means (110) connected to said programmable attenuator means for limiting the amplitude of said amplitude-adjusted selected audio signal in said transmit mode; and switching means (112) connected to said post limiter filter means for applying said selected audio signal to said transmitter audio input terminal in said transmitter mode and for applying said selected audio signal to said audio amplifier input terminal in said receive mode.

52. An audio processor integrated circuit as in claim 51 further comprising:

further multiplexing means (120) for selecting between an option board presence sensing signal and a battery voltage level signal;

programmable reference level producing means (121) for producing a reference level and for adjusting said reference level in response to the selection made by said further multiplexing means; and comparing means (123) connected to said further multiplexing means and to said programmable reference level producing means for comparing said reference level with said selected signal and for producing a comparator output signal indicating the results of said comparison.

53. An audio processor as in claim 52 wherein:

said audio processor further includes:

programmable squelch filter means (117) connected to receive said received audio signal for removing frequency components below a certain frequency from said received audio signal and for adjusting said certain frequency in response to operating frequency, and rectifier means (118) connected to said squelch filter means for converting said filtered received audio signal to a DC level;

said further multiplexing means is also connected to receive said DC level and selects between said DC level, said option board presence sensing signal and said battery voltage level signal; and said comparing means (123) is also for comparing said reference level with said DC level and for producing a squelch muting signal indicating the results of said comparing when said further multiplexing means selects said DC level.

54. An audio processor integrated circuit as in claim 52 further comprising sample and hold means (122) connected to receive said reference level for storing said reference level and for controlling the RF output level of said transmitter in said transmit mode in response to said stored reference level.

55. An audio processor as in claim 51 further including:

programmable squelch filter means (117) connected to receive said received audio signal for removing frequency components below a certain frequency from said received audio signal and for adjusting said certain frequency in response to operating frequency;

rectifier means (118) connected to said squelch filter means for converting said filtered received audio signal to a DC level;

programmable reference level producing means (121) for producing a reference level and for adjusting said reference level in response to RF receiver frequency; and comparing means (123) connected to said rectifier means and to said programmable reference level producing means for comparing said reference level with said DC level and for producing a squelch muting signal indicating the results of said comparison.

* * * * *